(12) United States Patent
Leum

(10) Patent No.: US 10,365,016 B1
(45) Date of Patent: Jul. 30, 2019

(54) SOLAR-POWERED MOBILE LOADING DOCK

(71) Applicant: Grant Leum, Excelsior, MN (US)

(72) Inventor: Grant Leum, Excelsior, MN (US)

( * ) Notice: Subject to any disclaimer, the term of this patent is extended or adjusted under 35 U.S.C. 154(b) by 0 days.

(21) Appl. No.: 15/977,547

(22) Filed: May 11, 2018

(51) Int. Cl.
| | |
|---|---|
| H02J 7/35 | (2006.01) |
| F24S 25/63 | (2018.01) |
| H01M 10/46 | (2006.01) |
| H02S 10/40 | (2014.01) |
| H02S 40/38 | (2014.01) |
| H01L 31/042 | (2014.01) |

(52) U.S. Cl.
CPC ............ *F24S 25/63* (2018.05); *H01L 31/042* (2013.01); *H01M 10/465* (2013.01); *H02J 7/355* (2013.01); *H02S 10/40* (2014.12); *H02S 40/38* (2014.12)

(58) Field of Classification Search
CPC ........... F24S 25/63; H02S 40/38; H02S 10/40
See application file for complete search history.

(56) References Cited

U.S. PATENT DOCUMENTS

| | | | |
|---|---|---|---|
| 4,624,446 A | 11/1986 | Gould | |
| 4,765,792 A | 8/1988 | Cherry et al. | |
| 5,368,043 A | 11/1994 | Sunouchi et al. | |
| 5,408,790 A * | 4/1995 | Hoesten | B65D 90/24 52/169.9 |
| 5,447,406 A * | 9/1995 | Voss | B66F 7/243 254/8 R |
| 6,368,043 B1 * | 4/2002 | Leum | B65G 69/005 14/71.7 |
| 6,396,239 B1 * | 5/2002 | Benn | F24S 30/452 320/101 |
| 7,069,611 B2 * | 7/2006 | Larson | B64F 1/30 14/71.1 |
| 7,216,392 B2 * | 5/2007 | Hoofard | B65G 69/2823 14/69.5 |
| 7,670,096 B2 | 3/2010 | Leum | |
| 2004/0250360 A1 * | 12/2004 | Young | B65G 69/30 14/69.5 |
| 2006/0021164 A1 * | 2/2006 | Mitchell | B65G 69/2811 14/71.1 |
| 2011/0181018 A1 * | 7/2011 | Bruneau | B60P 3/10 280/414.1 |
| 2012/0237331 A1 * | 9/2012 | Gabrielson | B65G 69/30 414/800 |
| 2014/0238467 A1 * | 8/2014 | Martin | H01L 31/052 136/248 |
| 2014/0271072 A1 * | 9/2014 | Friesen | B60P 1/438 414/537 |
| 2014/0356121 A1 * | 12/2014 | Leum | B65G 69/30 414/800 |
| 2015/0128360 A1 * | 5/2015 | Leum | B65G 69/287 14/72.5 |

(Continued)

*Primary Examiner* — Brian D Mattei
(74) *Attorney, Agent, or Firm* — Jansson Munger McKinley & Kirby Ltd.

(57) ABSTRACT

A mobile loading dock having a frame, a solar panel mounted to the frame and a planar ramp member. The frame including two opposing side rails and support beams, the support beams having a first end and a second end, the first end secured to one of the opposing side rails and the second end secured to the second opposing side rail. The solar panel is connected to a battery and a hydraulic pump to provide power for movement of the loading dock.

13 Claims, 3 Drawing Sheets

(56) References Cited

U.S. PATENT DOCUMENTS

2016/0107851 A1* 4/2016 Leum .................... B65G 69/30
                                                            14/72.5
2016/0285304 A1* 9/2016 Stiefel ................... H02J 7/355
2016/0301354 A1* 10/2016 Draffin, II .............. H02S 10/40

* cited by examiner

SOLAR-POWERED MOBILE LOADING DOCK

FIELD OF THE INVENTION

This invention relates to mobile loading docks and more particularly to a mobile loading dock with an open-grate surface for improved vehicle traction which is also solar powered.

BACKGROUND OF THE INVENTION

A variety of loading docks have been devised to adjust the height of different trailers to properly match the deck of the trailer to the height of the dock. By aligning the height of the trailer and the dock the loading and unloading of cargo is facilitated.

There are numerous such devices in the prior art. One such device is seen in U.S. Pat. No. 4,624,446 to Gould which discloses a reinforced platform pivotally mounted to the ground at one end and includes a solid surface ramp portion.

Loading docks of the prior art typically have certain disadvantages. The majority of moveable loading docks have a solid ramp surface onto which vehicles drive when loading and unloading cargo. These solid ramp surfaces can become slippery with rain or ice as well as covered in snow. This can cause difficulties with traction and mobility for both the vehicles and individuals involved as well as safety concerns. Removing snow or ice from solid surface ramp surfaces can be difficult and time consuming.

Mobile loading docks which are meant for outdoor use require wires or cords to power them. This can be problematic when the loading dock is kept outdoors year round and subjected to inclement weather. Having loose cords and wires running to a mobile loading dock can also create safety issues for workers.

Some mobile loading docks of the prior art have certain shortcomings and disadvantages to which this device is drawn. Specifically, it would be advantageous to have a mobile loading dock which has an improved open-grate platform for increased traction, mobility and safety.

It would also be advantageous to have a mobile loading dock which is solar powered, thereby avoiding the need for loose wires and cords.

In summary, there are problems and shortcomings in the prior art dock levelers and it is to these needs that this device is drawn.

OBJECTS OF THE INVENTION

It is an object of this invention to provide a mobile loading dock with an open-grate upper platform for improved vehicle mobility and traction.

Another object of this invention is to provide such a mobile loading dock with a planar ramp member that has an open-grate surface along its length for improved vehicle mobility and traction.

Yet another object of this invention is to provide a mobile loading dock that is solar powered.

These and other objects of the invention will be apparent from the following descriptions and from the drawings.

SUMMARY OF THE INVENTION

In a first embodiment of the present invention an outdoor mobile loading dock has a frame including two opposing side rails and support beams, the support beams having a first end and a second end, the first end secured to one of the opposing side rails and the second end secured to the second opposing side rail. The mobile loading dock also includes a solar panel mounted to the frame, the solar panel being connected to a battery and a hydraulic pump to provide power for movement of the loading dock and a planar ramp member having a lower end and an upper end. Power for the outdoor mobile loading dock is provided by the solar panel.

In highly preferred embodiments, the upper end includes an upper edge having a lip which can be activated between an extended/engaged position to contact a truck bed and a retracted/disengaged position. An upper ramp portion is adjacent the upper edge and substantially parallel to the ground and has an open-grate section to facilitate drainage of water through the open-grate section to the ground below. The upper ramp member is able to be moved between an upward and downward position. This configuration improves vehicle mobility and traction on the planar ramp member.

Preferably, the upper ramp portion includes an integrated dock leveler. It is also highly preferable that the planar ramp member is substantially comprised of an open-grate surface.

In preferred embodiments, the support beams are affixed to the underside of the upper ramp member and are configured to transfer and carry the forklift tire load.

It is preferable that the lip includes a moveable safety-barrier portion and that the planar ramp member and lip are powered by the solar-panel, hydraulic pump and battery. Preferred embodiments include the solar-panel, hydraulic pump and battery being a solar-powered hydraulic system to provide power enabling movement of the loading dock. The battery is a rechargeable battery.

Other highly preferred embodiments include an outdoor portable loading dock having a portable frame, solar panel and planar ramp member. The portable frame is configured to allow the dock to be moved to different locations and includes two opposing side rails and support beams, the support beams having a first end and a second end, the first end secured to one of the opposing side rails and the second end secured to the second opposing side rail. The solar panel is mounted to the frame and is connected to a battery and a hydraulic pump to provide power for movement of the loading dock. The planar ramp member has a lower end and an upper end. The upper end includes an upper edge having a lip. The lip is able to be activated between an extended/engaged position to contact a truck bed and a retracted/disengaged position. An upper ramp portion is adjacent the upper edge and is substantially parallel to the ground and has an open-grate section to facilitate drainage of water through the open-grate section to the ground below, thereby improving vehicle mobility and traction on the planar ramp member. The upper ramp member is able to be moved between an upward and downward position.

It is highly preferred that the upper ramp portion include an integral hinged dock leveler with a hinged safety barrier/lip. Preferably, the leveler bridges the gap from the ramp structure to the bed of the trailer. As trailers have a variety of trailer bed heights, the leading edge of the front-hinged lip that traverses into the trailer can safely be placed on any trailer bed which is between 34"-58" off of grade. This correlates to 98% or more of the trailers currently on the road.

It is also preferable to include an integral hinged dock leveler due to the float required as the forklift enters the trailer. As a forklift enters a trailer, the added weight of the forklift causes the suspension and tires on the trailer to move up and down as the weight fluctuates while loading or unloading of cargo occurs. Preferably, the dock leveler must be able to float to maintain a safe bridge between the trailer and ramp/dock.

It is highly preferred that the mobile loading dock include a hydraulic leveler with solar power. This eliminates a major problem with mechanical dock levelers, called "stump out," which is caused by the safety support legs that are on all mechanical dock plates. "Stump out" occurs on trailer beds below dock level, the mechanical leveler can have its legs retracted at the start of the operation, but due to the vertical float of the trailer bed, these legs can snap back into a vertical position restricting the vertical travel of the dock plate.

Preferably, the solar powered hydraulic system utilizes the vertically mounted lift cylinder and a hydraulic flow control valve to provide the safety needed in case of a trailer prematurely departing, causing the leveler lip to be unsupported. In the event of excessive flow, a velocity fuse will preferably hydraulically lock, keeping the leveler and forklift driver safely supported. Since the mobile loading dock of this application is preferably solar powered, the added safety and ease of use of a hydraulic dock leveler is provided without the typical additional wiring. Very often it is quite difficult, expensive and often impossible to get electrical service to the location of the portable or mobile dock as they are remote from buildings.

It is highly preferred that the upper ramp portion be made with open bar grating materials in lieu of the standard steel tread plate. Preferably, the structure of the open bar grate dock leveler uses the top bar grate to only transfer the forklift tire loads from beam to beam, therefore requiring the beam structure underneath to carry the entire load without composite benefit from the traffic surface (planar ramp member). Therefore, the beams are much larger and stronger in the open grate design than in a traditional dock plate.

Preferably, the mobile loading dock is used outdoors as the ramp surface is made of open grating to allow snow and ice to fall through which allows for better traction with the elimination of snow buildup on the ramp surface. With a traditional dock plate outside, the solid plate holds the snow and ice which can cause dangerous conditions. This is especially true considering a mechanical dock plate requires a person to walk up the inclined surface and to walk down the plate onto the trailer.

DETAILED DESCRIPTION OF PREFERRED EMBODIMENTS

Figure 1:
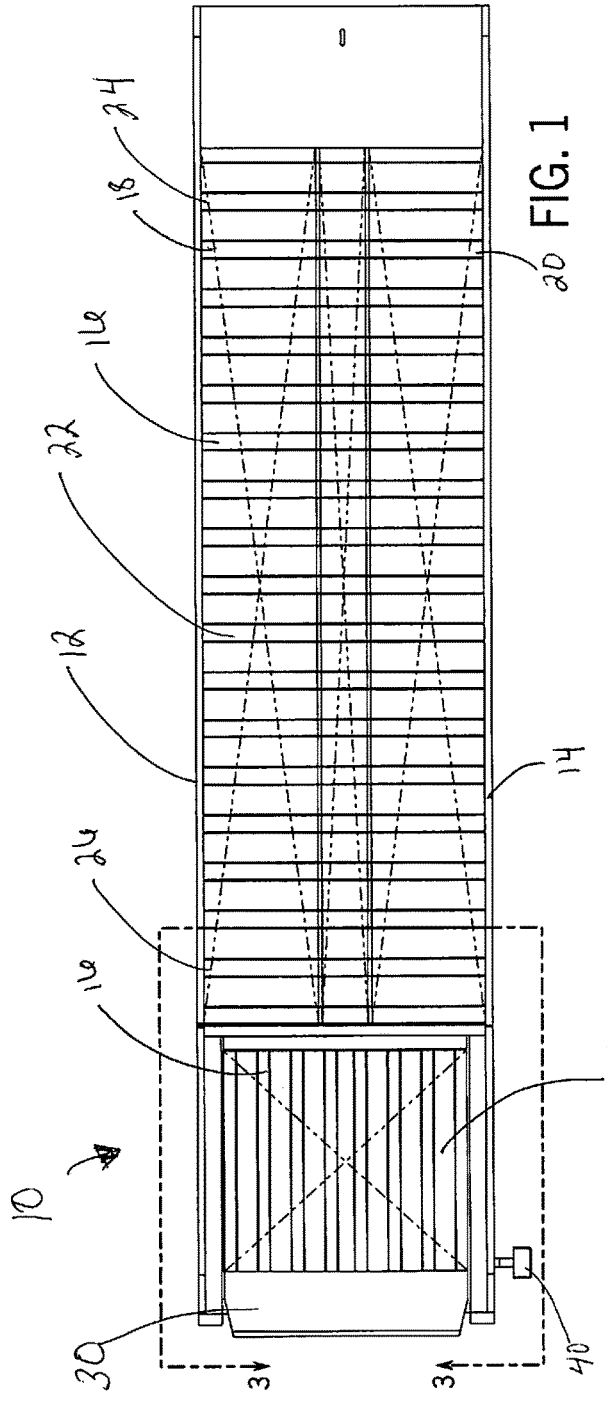
FIG. 1 is a top view of the mobile loading dock.
Figure 2:
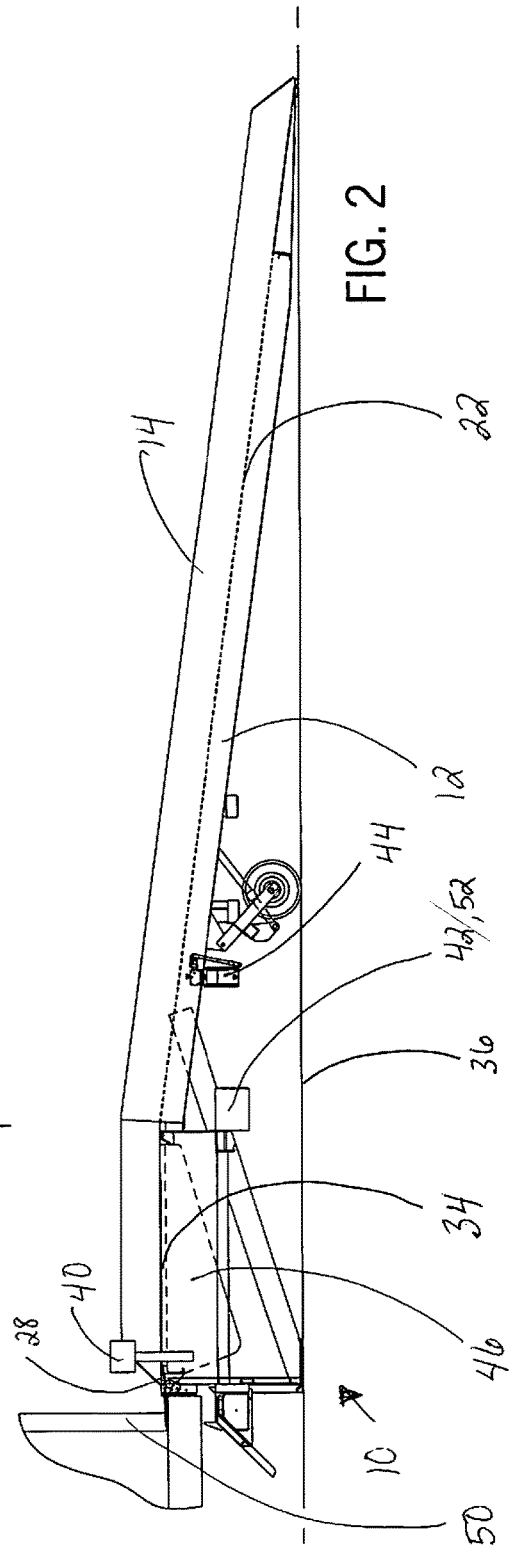
FIG. 2 is a side view of the mobile loading dock in FIG. 1.

A preferred embodiment of the present invention is shown in FIGS. 1-5. The outdoor mobile loading dock 10, as shown in FIGS. 1-5, includes a frame 12 which has two opposing side rails 14 and support beams 16, support beams 16 having a first end 18 and a second end 20. First end 18 is secured to one of opposing side rails 14 and second end 20 is secured to second opposing side rail 14. Loading dock 10 includes a solar panel 40 which is mounted to frame 12. Solar panel 40 is connected to a battery 42 and a hydraulic pump 44 to provide power for movement of loading dock 10 as well as for operation of integrated dock leveler 46 and these components are contained in a containment box 52 located on the underside of ramp 10. Power for the outdoor mobile loading dock 10 is provided by solar panel 40 and the related components.

FIGS. 1-5 illustrate that loading dock includes planar ramp member 22 has a lower end 24 and an upper end 26. Upper end 26 includes an upper edge 28 which has a lip 30, and lip 30 is able to be activated between an extended/engaged position to contact a truck bed (not shown) and a retracted/disengaged position. Planar ramp member 22 has an upper ramp portion 34 adjacent upper edge 28 and is substantially parallel to the ground 36 with an open-grate section 38 to facilitate drainage of water through open-grate section 38 to the ground 36 below. Planar ramp member 22 is able to be moved between upward and downward positions. As a result vehicle mobility and traction on planar ramp member 22 is improved.

Typical loading docks of the prior art use solid diamond plate as the ramp surface. This can cause safety hazards because snow and ice can pack onto the solid ramp surface rather than falling through it. The inventive loading dock 10 is used outdoors so traction and snow/ice removal are critical.

It is within the scope of the invention to use a solar-powered hydraulic system to provide power enabling movement of loading dock 10. Loading dock 10 can be manufactured either with or without solar panel 40. If loading dock 10 does not include solar panel 40 other conventional power sources can be used. Using a solar panel 40 with a battery 42 eliminates the need to run cords or power outside to the location of loading dock 10 since the inventive loading dock 10 is an outdoor mobile loading dock. Some embodiments of the invention also include a built-in battery charger (not shown).

Figure 3:
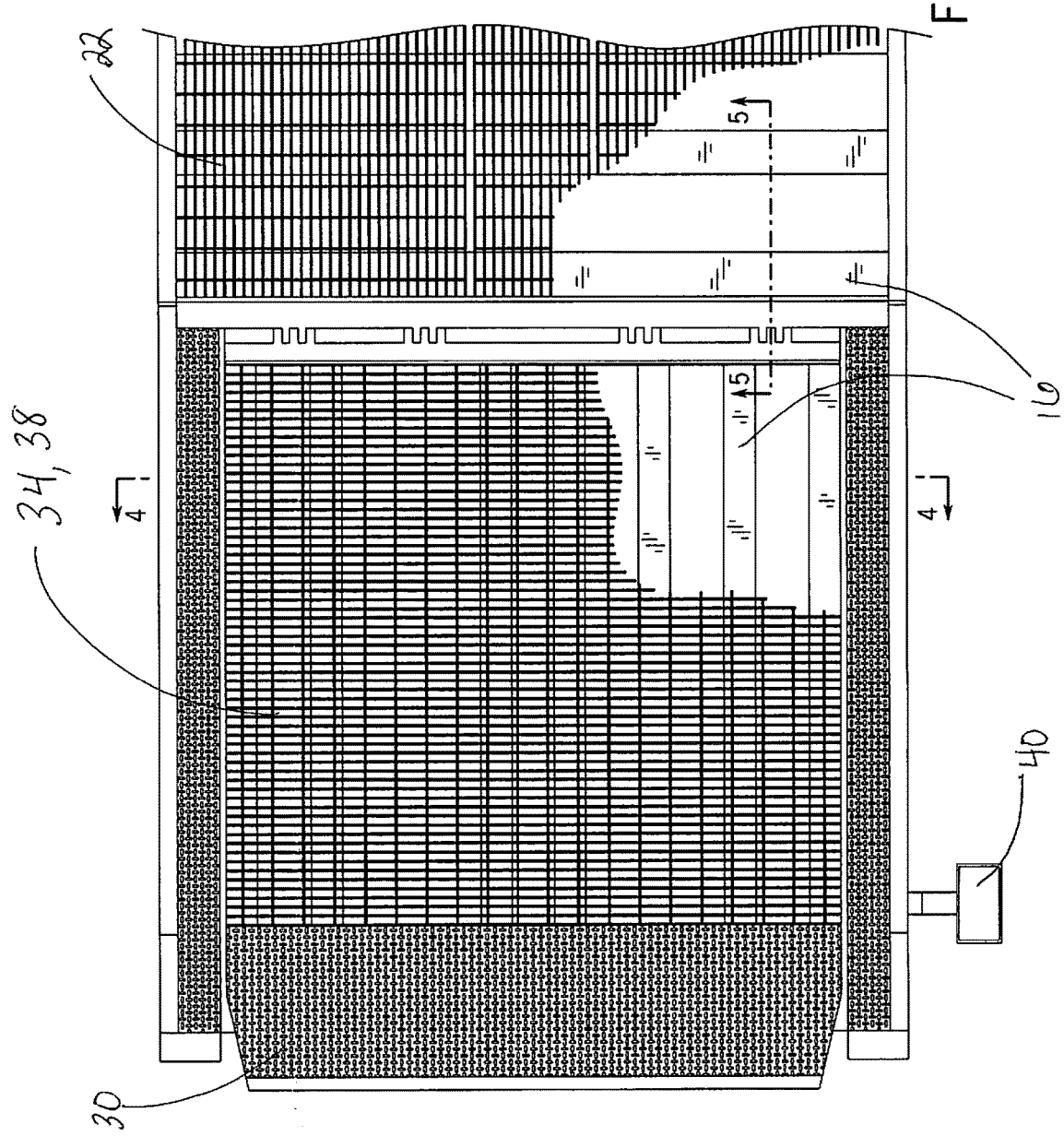
FIG. 3 is a perspective view of the upper end of the mobile loading dock in FIG. 1.

FIG. 3 illustrates that planar ramp member 22 is substantially comprised of open-grate surface 38. Open-grate surface 38 allows snow, ice or rain to fall through the open surface and to not build up on the ramp surface. This greatly improves traction and safety issues when loading dock 10 is in use.

FIGS. 1 and 3 illustrate that support beams 16 are affixed to an underside of planar ramp member 22 and are configured to transfer and carry the forklift tire load. Support beams 16 can be I-beams as well as tube, channel-shaped or other shapes to satisfy specific structural needs. These will be apparent to those skilled in the art.

Figure 4:
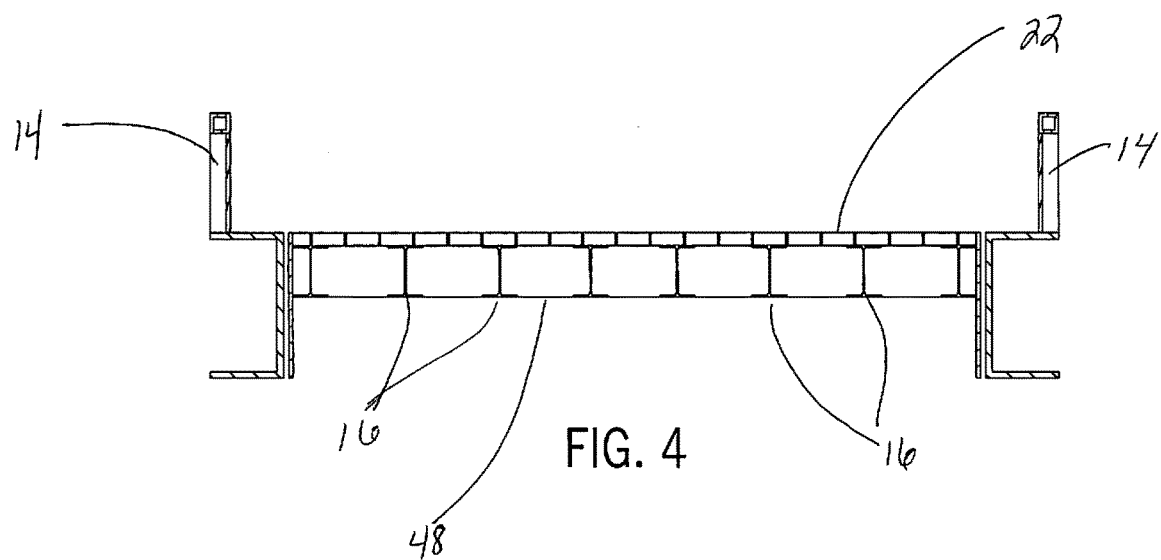
FIG. 4 is a view of the mobile loading dock embodiment of FIG. 3 taken in the direction of line 4-4.
Figure 5:
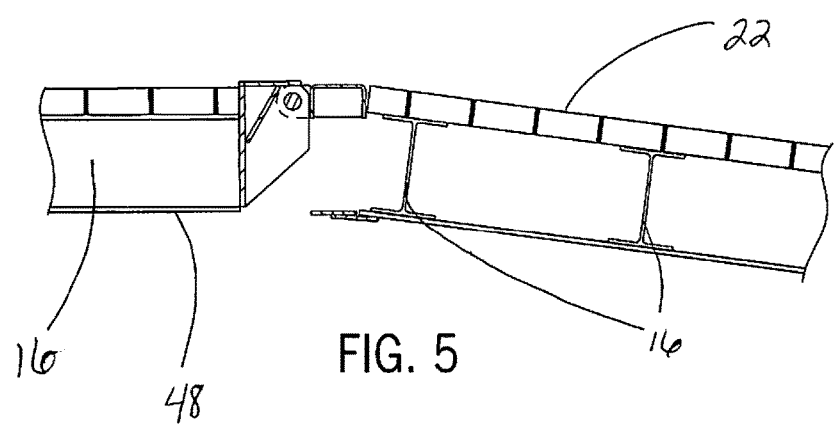
FIG. 5 is a further view of the mobile loading dock embodiment of FIG. 3 taken in the direction of line 5-5.

FIGS. 4 and 5 illustrate in more detail that appropriately sized I-beams can be used and affixed to the underside of planar ramp member 22. As can be seen best in FIGS. 3 and 5, the direction of support beams 16 changes at the intersection of lower end 24 of planar ramp member 22 and upper ramp portion 34. Support beams 16 are affixed to the underside of upper ramp member 48 as well as affixed to the underside of the complete length of planar ramp member 22 except at a lower edge of lower end 24. FIG. 3 has a cutaway portion which illustrates support beams 16 underneath open-grate section 38.

FIG. 3 also illustrates that upper ramp portion 34 is comprised of open-grate section 38 and includes an integrated dock leveler 46.

Upper end 26 of loading dock 10 includes a lip 50 at upper edge 28 as seen in FIG. 3. Lip 50 is also powered by solar panel 40, hydraulic pump and battery. Lip 50 includes a moveable safety-barrier portion and is at least five inches high. When in use, lip 50 rotates onto the bed of a truck/trailer for easy loading and unloading. When not in use, lip 50 can also rotate to act as an upright safety barrier to prevent fork trucks from driving off the end of mobile loading dock 10 inadvertently.

An alternative highly-related embodiment includes outdoor portable loading dock 10 having portable frame 12 configured to allow dock 10 to be moved to different locations. Portable frame 12 includes two opposing side rails 14 and support beams 16. Dock 10 includes planar ramp member 22 which is separate from and not integrally formed with portable frame 12. Planar ramp member 22 has lower end 24 and upper end 26 with upper end 26 including upper edge 28 with lip 50. Lip 50 is able to be activated between an extended/engaged position to contact a truck bed and a retracted/disengaged position (not shown). In this embodiment, upper ramp portion 34 is also adjacent upper edge 28 and substantially parallel to ground 36 and has open-grate section 38 to facilitate drainage of water through open-grate section 38 to the ground 36 below. In this embodiment, planar ramp member 22 is not welded to frame 12.

A wide variety of materials are available for the various parts discussed and illustrated herein. Although the device has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

The invention claimed is:

1. A mobile loading dock comprising:
   a frame including (a) two opposing side rails, and (b) support beams, the support beams having a first end and a second end, the first end secured to one of the opposing side rails and the second end secured to the second opposing side rail;
   a solar panel mounted to the frame, the solar panel being connected to a battery and a hydraulic pump to provide power for movement of the loading dock; and
   a planar ramp member having a lower end and an upper end, the upper end including an upper edge having a lip, the lip being able to be activated between an extended/engaged position to contact a truck bed and a retracted/disengaged position when powered and the lip being powered by the solar panel, the hydraulic pump and the battery; and an upper ramp portion adjacent the upper edge and being substantially parallel to the ground and having an open-grate section to facilitate drainage of water through the open-grate section to the ground below, the planar ramp member being able to be moved between an upward and downward position,
   wherein power for the outdoor mobile loading dock is provided by the solar panel and vehicle mobility and traction on the planar ramp member are improved by the open-grate section.

2. The mobile loading dock of claim 1 wherein the upper ramp portion includes an integrated dock leveler.

3. The mobile loading dock of claim 1 wherein the planar ramp member is substantially comprised of an open-grate surface.

4. The mobile loading dock of claim 1 wherein the support beams are affixed to an underside of the planar ramp member and are configured to transfer and carry a forklift tire load.

5. The mobile loading dock of claim 1 wherein the battery is a rechargeable battery.

6. The mobile loading dock of claim 1 wherein the lip includes a moveable safety-barrier portion.

7. The mobile loading dock of claim 1 wherein the solar-panel, hydraulic pump and battery comprise a solar-powered hydraulic system to provide power enabling movement of the loading dock.

8. An outdoor portable loading dock comprising:
   a portable frame configured to allow the dock to be moved to different locations, the portable frame including (a) two opposing side rails, and (b) support beams, the support beams having a first end and a second end, the first end secured to one of the opposing side rails and the second end secured to the second opposing side rail;
   a solar panel mounted to the frame, the solar panel connected to a battery and a hydraulic pump to provide power for movement of the loading dock; and
   a planar ramp member having a lower end and an upper end, the upper end including an upper edge having a lip, the lip having a moveable safety-barrier portion, the lip being able to be activated between an extended/engaged position to contact a truck bed and a retracted/disengaged position when powered and the lip being powered by the solar panel, the hydraulic pump and the battery; and an upper ramp portion adjacent the upper edge and being substantially parallel to the ground and having an open-grate section to facilitate drainage of water through the open-grate section to the ground below, an upper ramp member being able to be moved between an upward and downward position,
   wherein vehicle mobility and traction on the planar ramp member are improved by the open-grate section.

9. The mobile loading dock of claim 8 wherein the upper ramp portion includes an integrated dock leveler.

10. The mobile loading dock of claim 8 wherein the planar ramp member is substantially comprised of an open-grate surface.

11. The mobile loading dock of claim 8 wherein the support beams are affixed to the underside of the planar ramp member and are configured to transfer and carry a forklift tire load.

12. The mobile loading dock of claim 8 wherein the battery is a rechargeable battery.

13. The mobile loading dock of claim 8 wherein the solar-panel, hydraulic pump and battery comprise a solar-powered hydraulic system to provide power enabling movement of the loading dock.

* * * * *